US009406390B2

(12) United States Patent
Kim et al.

(10) Patent No.: US 9,406,390 B2
(45) Date of Patent: Aug. 2, 2016

(54) STORAGE DEVICE AND RELIABILITY VERIFICATION METHOD

(71) Applicants: Kyungryun Kim, Seoul (KR); Taehoon Kim, Hwaseong-Si (KR); Sangkwon Moon, Osan-Si (KR)

(72) Inventors: Kyungryun Kim, Seoul (KR); Taehoon Kim, Hwaseong-Si (KR); Sangkwon Moon, Osan-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/731,779

(22) Filed: Jun. 5, 2015

(65) Prior Publication Data

US 2016/0104539 A1    Apr. 14, 2016

(30) Foreign Application Priority Data

Oct. 8, 2014    (KR) .................. 10-2014-0135611

(51) Int. Cl.
*G11C 11/34* (2006.01)
*G11C 16/28* (2006.01)
*G11C 16/34* (2006.01)

(52) U.S. Cl.
CPC ............ *G11C 16/28* (2013.01); *G11C 16/3495* (2013.01)

(58) Field of Classification Search
USPC .............. 365/185.03, 185.09, 185.12, 185.17, 365/185.2, 185.22, 185.29, 185.33
See application file for complete search history.

(56) References Cited

U.S. PATENT DOCUMENTS

| | | | |
|---|---|---|---|
| 6,628,545 B1 * | 9/2003 | Li | G11C 16/3404 365/185.29 |
| 7,414,886 B2 | 8/2008 | Li et al. | |
| 7,495,956 B2 | 2/2009 | Fong et al. | |
| 7,679,133 B2 | 3/2010 | Son et al. | |
| 7,876,620 B2 | 1/2011 | Mokhlesi et al. | |
| 7,911,846 B2 | 3/2011 | Hemink | |
| 7,916,548 B2 * | 3/2011 | Futatsuyama | G11C 16/344 365/185.2 |
| 8,149,623 B2 | 4/2012 | Uchikawa et al. | |
| 8,189,395 B2 | 5/2012 | Shiga et al. | |
| 8,316,278 B2 | 11/2012 | Ahn et al. | |
| 8,391,074 B2 | 3/2013 | Komatsu | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,675,416 B2 * | 3/2014 | Lee | G11C 16/3459 365/185.22 |
| 8,879,318 B2 * | 11/2014 | Ahn | G11C 16/0483 365/185.03 |
| 2011/0233648 A1 | 9/2011 | Seol et al. | |
| 2011/0320688 A1 | 12/2011 | Lee | |
| 2013/0064013 A1 | 3/2013 | Lee et al. | |
| 2014/0223246 A1 | 8/2014 | Kim et al. | |

FOREIGN PATENT DOCUMENTS

JP        2010020837 A    1/2010
KR    1020110001100 A    1/2011

* cited by examiner

*Primary Examiner* — Trong Phan
(74) *Attorney, Agent, or Firm* — Volentine & Whitt, PLLC

(57) ABSTRACT

A method controlling the execution of a reliability verification operation in a storage device including a nonvolatile memory device includes; determining whether a read count for a designated unit within the nonvolatile memory device exceeds a count value limit, and upon determining that the read count exceeds the count value limit, executing the reliability verification operation directed to the designated unit, wherein the count value limit is based on at least one of read count information, page bitmap information and environment information stored in the storage device.

23 Claims, 17 Drawing Sheets

FIG. 6

| PE Cycle | RINC Start | RINC Interval |
|---|---|---|
| 0.1K | 50K | 750 |
| 0.2K | 35K | 500 |
| ⋮ | ⋮ | ⋮ |

FIG. 7

| Area | RINC Start | RINC Interval |
|---|---|---|
| SLC | CNT_SLC | INTRVAL_SLC |
| MLC | CNT_MLC | INTRVAL_MLC |
| TLC | CNT_TLC | INTRVAL_TLC |

STORAGE DEVICE AND RELIABILITY VERIFICATION METHOD

CROSS-REFERENCE TO RELATED APPLICATION

This U.S. non-provisional patent application claims priority under 35 U.S.C. §119 to Korean Patent Application No. 10-2014-0135611 filed on Oct. 8, 2014, the subject matter of which is hereby incorporated by reference herein.

BACKGROUND

The inventive concept relates generally to storage devices capable of executing a reliability verification operation.

Ensuring the reliability of data stored in a storage device including one or more nonvolatile memory devices is an increasingly difficult task as nonvolatile memory devices are subjected to the rigors of contemporary mobile devices.

SUMMARY

Embodiments of the inventive concept provide a method controlling the execution of a reliability verification operation in a storage device including a nonvolatile memory device and a memory controller. The method includes; determining whether a read count for a designated unit within the nonvolatile memory device exceeds a count value limit, and upon determining that the read count exceeds the count value limit, executing the reliability verification operation directed to the designated unit, wherein the count value limit is based on at least one of read count information, page bitmap information and environment information stored in the storage device.

Embodiments of the inventive concept provide a method of operating a storage device including a nonvolatile memory device and a memory controller controlling operation of the nonvolatile memory device. The method includes; maintaining in the nonvolatile memory device a read count table listing a number of read requests directed to each one of a plurality of designated units within the nonvolatile memory device, upon receiving a read request direct to memory cells of a selected word line, determining whether to execute a dummy read operation in response to a read count stored in the read count table and state information associated with an unselected word line, executing the dummy read operation directed to either memory cells connected to an open word line, or memory cells connected to a word line adjacent to the selected word line, determining whether to execute a read reclaim operation based on a result of executing the dummy read operation, and executing the read reclaim operation directed to a memory block including the memory cells connected to the selected word line.

Embodiments of the inventive concept provide a storage device including; a nonvolatile memory device including a plurality of memory blocks, and a memory controller configured to control the nonvolatile memory device, wherein in response to a read request identifying a memory block among the plurality of memory blocks, the memory controller is configured to execute a reliability verification operation directed to the memory block in response to one of a read count and environmental information, and the read count and state information associated with an unselected word line.

BRIEF DESCRIPTION OF THE DRAWINGS

The above and other features and advantages of the inventive concept will become more apparent upon consideration of certain embodiments of the illustrated in the accompanying drawings.

FIGS. 6 and 7 are respective tables listing exemplary control values that may be used in a method of controlling the execution of a reliability verification operation according to embodiments of the inventive concept.

DETAILED DESCRIPTION

Figure 1:
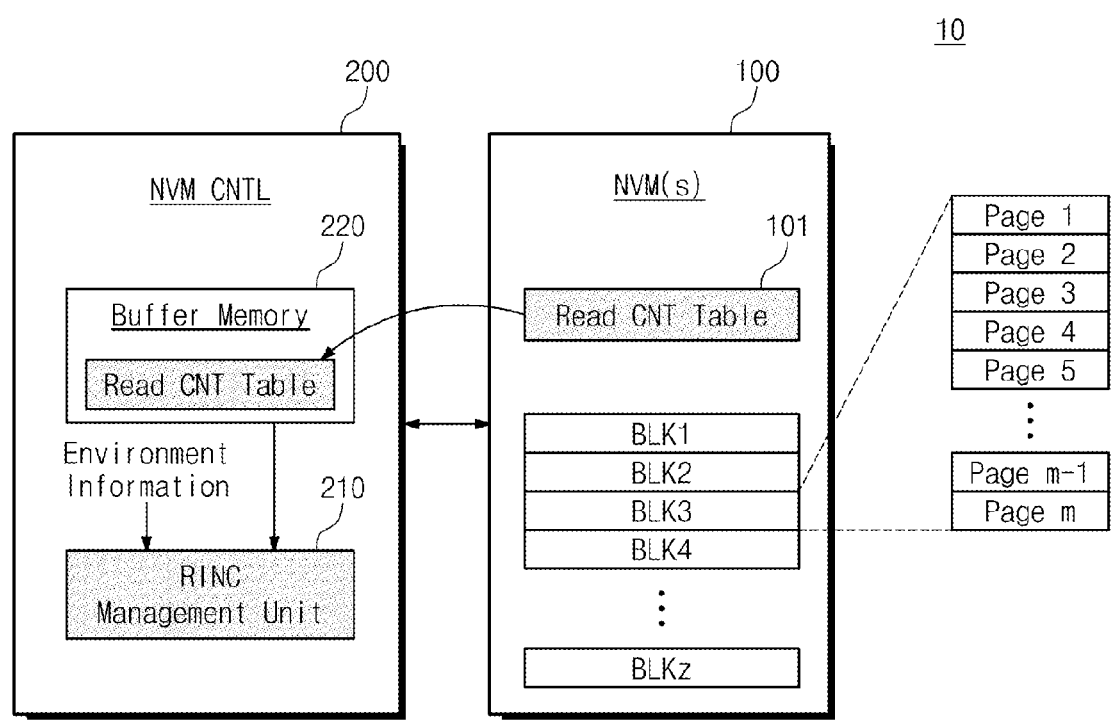
FIG. 1 is a block diagram illustrating a storage device according to an embodiment of the inventive concept.

Certain embodiments of the inventive concept will now be described with reference to the accompanying drawings. However, the inventive concept may be variously embodied and should not be construed as being limited to only the illustrated embodiments. Throughout the written description and drawings, like reference numbers denote like or similar elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion e.g., "between" versus "directly between", "adjacent" versus "directly adjacent", etc. . . . .

The terminology used herein is for the purpose of describing particular embodiments only and is not intended to be limiting of example embodiments of the inventive concept. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in relation to certain illustrated embodiments, certain functions, acts, and/or steps may be performed in an order other than the specific order described in relation to illustrated embodiments. Further, two or more functions, acts and/or steps shown as occurring in succession may, in fact, be executed substantially concurrently or may sometimes be executed in a reverse order depending on the functionality, acts and/or steps involved.

Unless otherwise defined, all terms, including technical and scientific terms, used herein have the same meaning as commonly understood by one of ordinary skill in the art to which example embodiments of the inventive concept belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A storage device according to embodiments of the inventive concept may execute an optimized reliability verification operation based on a read count and environmental information, or the read count and state information related to an unselected word line. Examples of this approach (e.g., use of a reliability operation (RINC) based on a read count) are described in U.S. Pat. No. 8,316,287 and U.S. patent application Ser. No. 14/147,063, the collective subject matter of which is hereby incorporated by reference. In the following, environmental information and state information of unselected word line are distinctly described. However, the state information of the unselected word line may be included in the environmental information in a broader sense.

FIG. 1 is a block diagram illustrating a storage device according to embodiments of the inventive concept. Referring to FIG. 1, the storage device 10 generally includes at least one nonvolatile memory device 100 (NVM(s)) (hereafter, "memory device 100") and a memory controller 200 (NVM CNTL) controlling the memory device 100.

The memory device 100 may be embodied using NAND flash memory, vertical NAND (VNAND), NOR flash memory, resistive random access memory (RRAM), phase-change memory (PRAM), magneto resistive random access memory (MRAM), ferroelectric random access memory (FRAM), and/or spin transfer torque random access memory (STT-RAM). Also, the memory device 100 may be implemented using one or more memory cells arrays having a three dimensional (3D) structure. Certain embodiments of the inventive concept may be applied to flash memory devices including a conductivity floating gate as an electron storage layer, as well as charge trap flash (CTF) devices including an insulating film as the electron storage layer. The illustrated embodiments that follow assume that the memory device 100 is a NAND flash memory device. Further, the memory device 100 is assumed to include a plurality of memory blocks (e.g., BLK1~BLKz, where 'z' is an integer greater than 1). Each of the plurality of memory blocks BLK1~BLKz is further assumed to include a plurality of pages (e.g., Page 1~Page m, wherein 'm' is an integer greater than 1). The memory device 100 illustrated in FIG. 1 includes a read count table 101 (Read CNT Table) that stores a read count. Herein, a "read count" may correspond to a number of read requests received from a source external to the storage device 10 (e.g., a host), or a number of read requests internally generated by the storage device 10.

In certain embodiment of the inventive concept, the read count will be stored in the read count table 101 according to block units, but in other embodiments of the inventive concept, the read count will be stored in the read count table 101 according to super block units, where a "super block" includes at least two memory blocks. In this regard, a super block may include at least two memory blocks disposed in the same or different chips. In still other embodiments of the inventive concept, the read count will be stored in the read count table 101 according to page units, multiple page units or sub-block units.

The memory controller 200 of FIG. 1 includes a random interval neighbor check (RINC) management unit 210 and a buffer memory 220. The RINC management unit 210 may be used to manage execution of a reliability verification operation, alternately referred to in certain applications as a RINC operation, based on a read count and environmental information. Here, the environmental information may include information associated with at least one of; a program/erase (P/E) cycle, program count, erase count, a number of errors occurring during a read operation, an error rate, threshold voltage shifting, memory cell wear level(s), degradation degree, data input/output (I/O) time requirements, temperature, memory cell location, memory array structure, and/or state neighboring memory cell(s).

The reliability verification operation may be executed as a dummy read operation directed to least one word line, or open word line, where an "open word line" is one unselected by a program operation.

Thus, the RINC management unit 210 of FIG. 1 may determine whether the reliability verification operation is based on a read count for a particular block corresponding to an externally provided read request and/or degradation information associated with the particular block.

The buffer memory 220 may be used to read the read count table from the memory device 100 during a power-up operation for the storage device 10. The buffer memory 220 may increase the read count based on an externally provided read request associated with (e.g.,) a normal read operation and/or an internally generated read request associated with a dummy read operation. In this regard, the buffer memory 220 may update the read count table 101 on a periodic or aperiodic basis.

With this configuration, the storage device 10 of FIG. 1, may execute a reliability verification operation based on a read count and relevant environmental information, whereby the storage device 10 may improve data reliability, and provide more optimal performance in regard to data I/O time reductions, for example.

Figure 2:
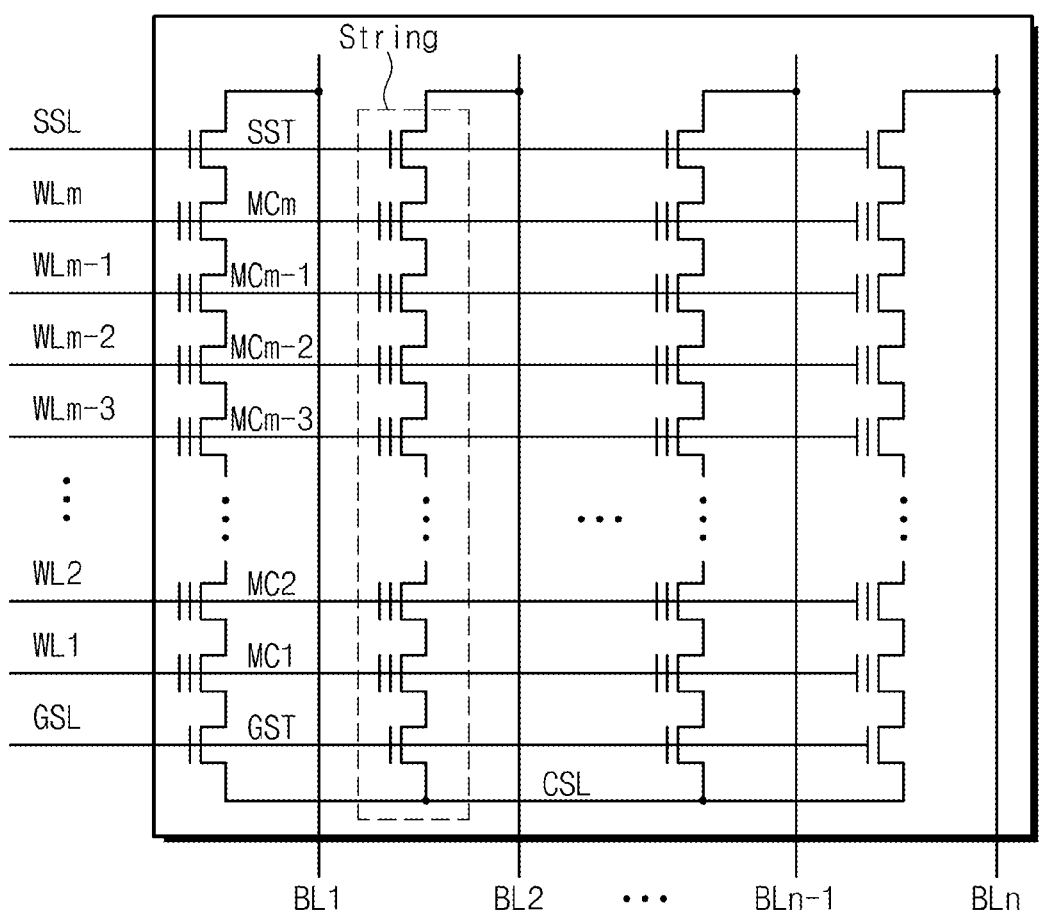
FIG. 2 is a partial circuit diagram further illustrating in one example the memory block of FIG. 1.

FIG. 2 is a partial circuit diagram corresponding to a single block BLK of the memory device 100 of FIG. 1. However, the other blocks in the plurality of blocks assumed for FIG. 1 may be similarly configured. Referring to FIG. 2, the block BLK includes a plurality of strings connected bit lines (BL1~BLn, where 'n' is an integer greater than 1) and word lines (WL1~WLm, where 'm' is an integer greater than 1). Herein, the strings may include at least one string selection transistor SST, a plurality of memory cells (MC1~MCm, again where 'm' is an integer greater than 1), at least one ground selection transistor GST connected in series between the bit line and common course line CSL. Each memory cell MC1~MCm may store at least one or more data bits. Each of the strings may include at least one dummy cell between the string selection transistor SST and the memory cells MC1~MCm, and at least one dummy cell between the ground selection transistor GST and the memory cells MC1~MCm.

Figure 3:
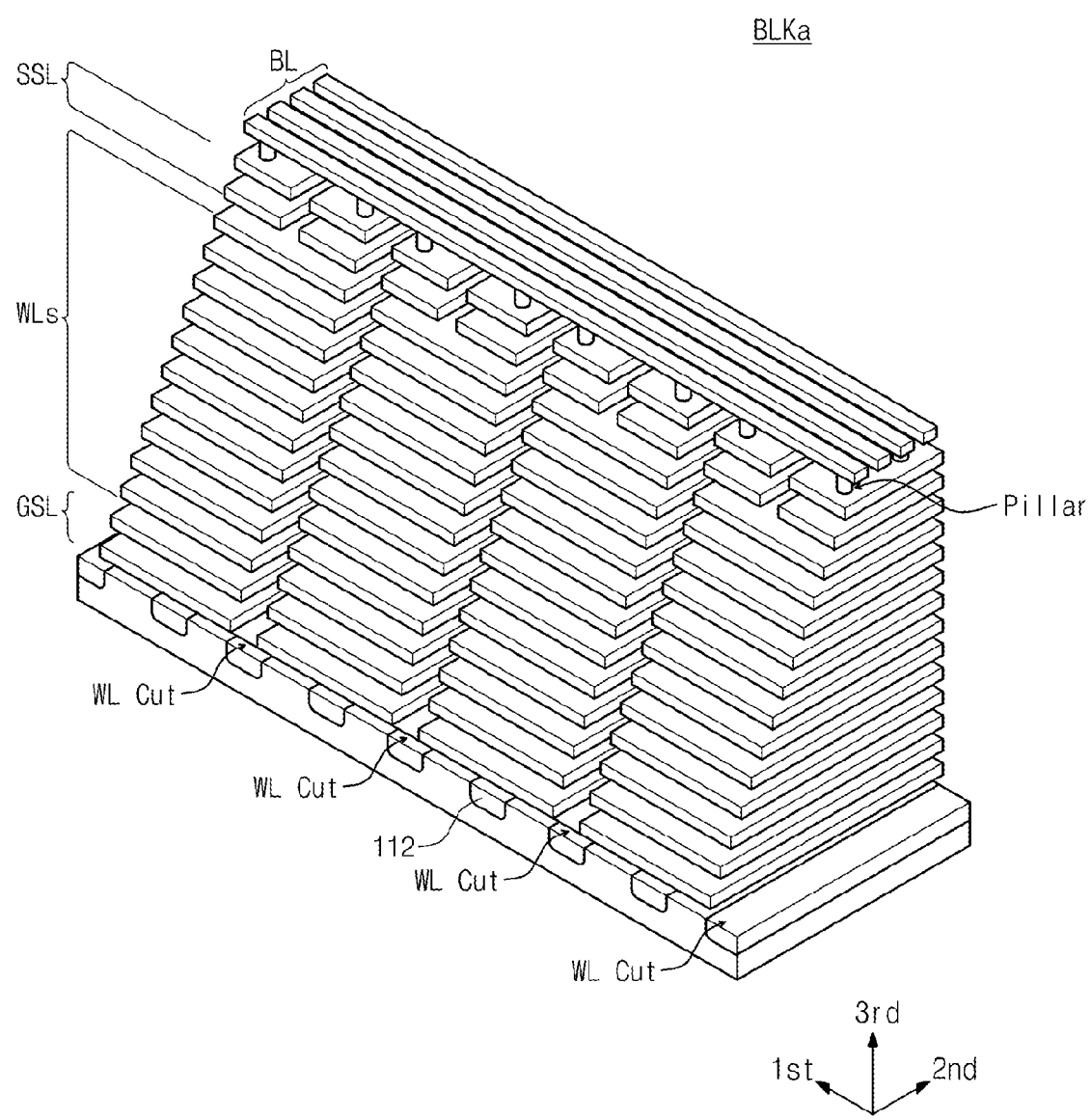
FIG. 3 is a perspective diagram further illustrating in another example the memory block of FIG. 1.

FIG. 3 is a perspective view relative to $1^{st}$, $2^{nd}$ and $3^{rd}$ directions illustrating a memory block BLKa that may be used in certain embodiments of inventive concept. Referring to the FIG. 3, the block BLKa is shown as including four (4) sub-blocks disposed on a principal substrate. Each of the sub-blocks is formed by layering at least one ground selection line GSL, a plurality of word lines WLs, at least one string selection line SSL as plate-like on the substrate between word line cut (WL Cut). Herein, at least one string selection line SSL may be separated by a string selection line cut.

For example, at least one dummy word line may be layered as a plate form between the ground selection line GSL and word lines. At least one dummy word line may be layered as a plate form between the string selection line SSL and word lines.

Each of word line cuts, not shown, may include common source line CSL. For example, common source line included in each word line cut is connected in common. A pillar connected to the bit lines may penetrate through at least one ground selection line GSL, word lines WLs, and at least one string selection line SSL. In this manner, as one example, a string may be formed.

In FIG. 3, a target between word line cut is described as a sub-block, however, the scope of the inventive concept is not limited to this configuration, and a "sub-block" for purposes of the present description be a subject between word line cut and string selection line cut. Further, the block BLKa of FIG. 3 may be embodied with a merged word line structure, where at least two word lines are merged into one word line.

Figure 4:
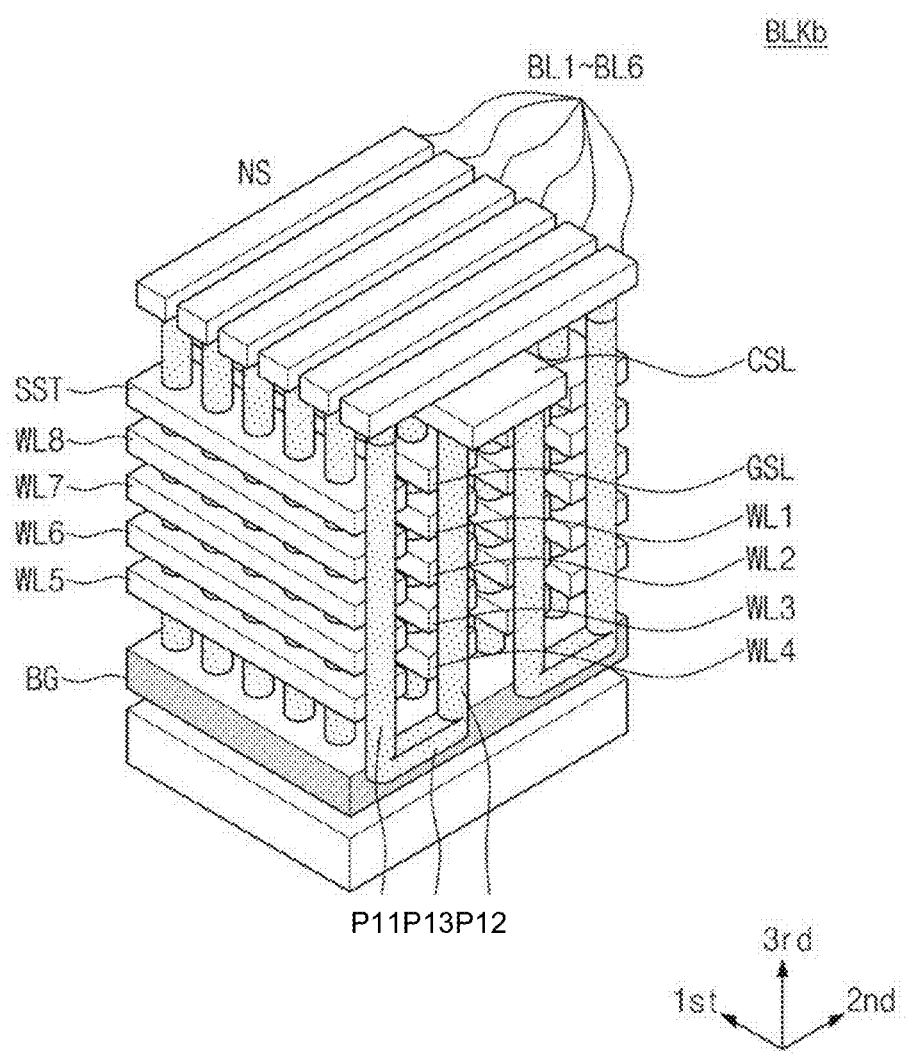
FIG. 4 is a perspective diagram further illustrating in another example the memory block of FIG. 1.

FIG. 4 is a perspective view relative to $1^{st}$, $2^{nd}$ and $3^{rd}$ directions illustrating a memory block BLKb according to another embodiment of the inventive concept. Referring to the FIG. 4, it is assumed that block BLKb includes four (4) word lines. The memory block is embodied as a pipe-shaped bit cost scalable (PbiCS) structure to connect bottoms of memory cells connected in series. The memory block BLKb is further assumed to include (m×n) strings NS.

Thus, for example, assuming that 'm' is 6 and 'n' is 2, each of the strings NS may include memory cells (MC1~MC8) connected in series, where a first upper part of the memory cells MC1~MC8 is connected with the string selection transistor STT, and a second upper part of the memory cells MC1~MC8 is connected with the ground selection transistor GST. Here, the bottom of the memory cells MC1~MC8 is connected with pipe.

In this manner, the memory cells of the string NS may be formed by layering of a plurality of semiconductor layers. Each of the strings NS may include a first pillar PL11, a second pillar PL12, and a pillar connection PL13 connecting the first pillar PL11 and second pillar PL12. The first pillar PL11 may be connected to the bit line (e.g., BL1) and the pillar connection PL13. The first pillar PL11 may be formed by penetrating through the string selection line SSL and a number of word lines (e.g., WL5~WL8). The second pillar PL12 may be connected to the common source line CSL and the pillar connection PL13. The second pillar PL12 may be formed by penetrating through the ground selection line GSL and a number of word lines (e.g., WL1~WL4). As illustrated in FIG. 4, the string NS may be formed as a U-shape pillar.

Additionally with respect to the embodiment illustrated in FIG. 4, a back gate BG may be formed on the substrate. The pillar connection PL13 may be formed in the back gate BG. Thus, in certain embodiments the back gate BG may be commonly configured with the block BLKb, and in other embodiments the back gate BG will be separate.

Figure 5:
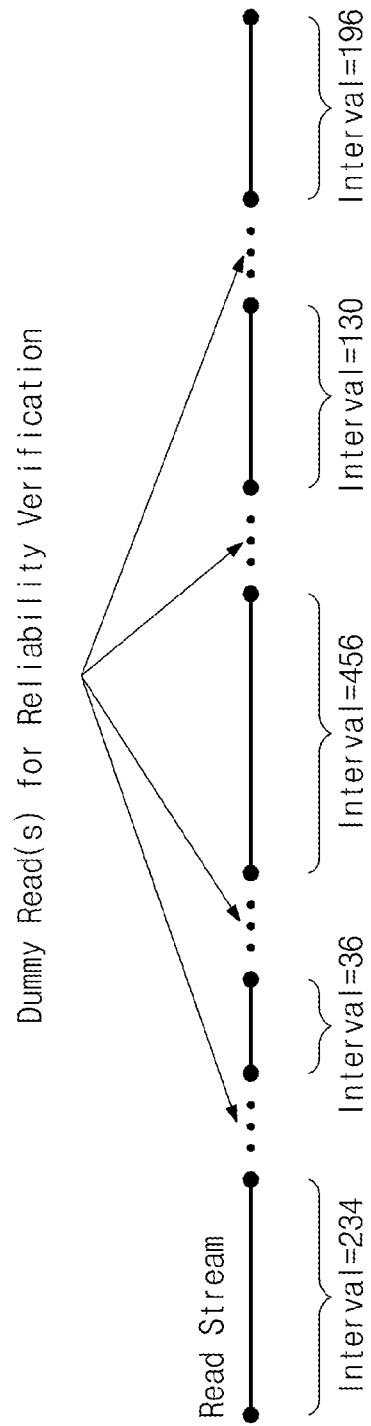
FIG. 5 is a conceptual diagram illustrating a random interval neighbor check (RINC) operation according to embodiments of the inventive concept.

FIG. 5 is a conceptual diagram illustrating execution of a reliability verification (or RINC) operation according to embodiments of the inventive concept. Referring to FIGS. 1 and 5, the storage device 10 may execute a dummy read operation in order to verify the reliability of a designated portion (or "unit") of a constituent memory cell array (e.g., a page, multiple pages, a sub-block, a block, or super block). Thus, the dummy read operation constitutes part of the reliability verification operation. As illustrated in FIG. 5, the dummy read operation may be executed according to a variable interval. Thus, the read interval associated with the dummy read operation may be different from the value of a read count for the designated unit. In the example illustrated in FIG. 5, during a read operation stream (i.e., a successively executed stream of read operations), a first dummy read operation is executed after a first interval equal to a read count of 234; a second dummy read operation is executed after a second interval equal to a read count of 36; a third dummy read operation is executed after a third interval equal to a read count of 456; and fourth dummy read operation is executed after a fourth interval equal to a read count of 130. FIG. 5 further illustrates a fifth interval equal to a read count of 196 subsequent the fourth dummy read operation.

Thus, in certain embodiments of the inventive concept, the execution interval for dummy read operations performed as part of an overall reliability verification operation may be varied according to application and storage device environmental factors.

FIG. 6 is a table listing exemplary values (where K denotes 1000) associated with a RINC management method according to embodiments of the inventive concept. Referring to FIG. 6, the execution of dummy read operations may be managed differently according to a program/erase (PE) cycle (PE Cycle) for a designated unit. For example, an initial start read count (RINC Start) or an interval (RINC Interval) associated with the dummy read operation may vary according to PE cycle.

FIG. 7 is a table listing exemplary values associated with a RINC management method according embodiments of the inventive concept. Referring to FIG. 7, the execution of a dummy read operation may be managed differently according to an "area" (or region) of the designated unit. For example, the initial start read count of dummy read operation (CNT_SLC, CNT_MLC, CNT_TLC) or interval of dummy read operation (INTRVL_SLC, INTRVL_MLC, INTRVL_TLC) are different according to each of single-level cell (SLC) area, multi-level cell (MLC) area, triple-level cell (TLC) area.

Figure 8:
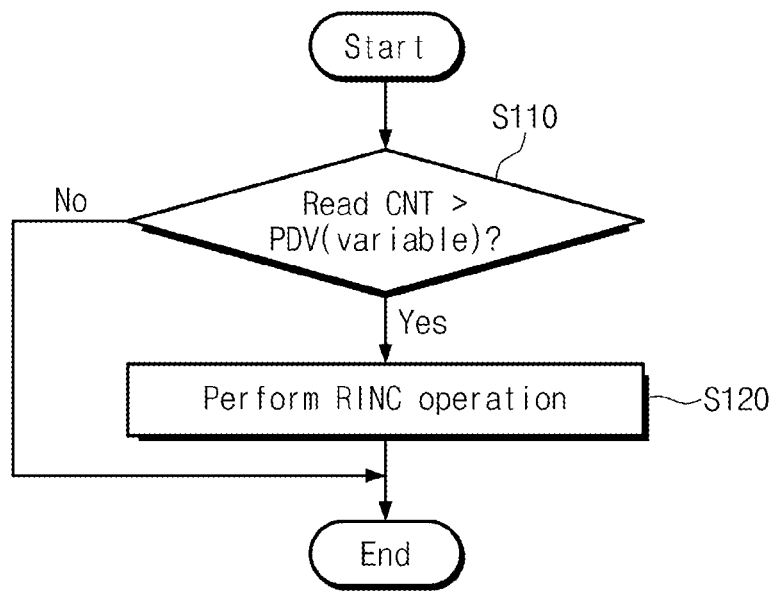
FIG. 8 is a flowchart generally summarizing a method controlling the execution of a RINC operation in a storage device according to embodiments of the inventive concept.

FIG. 8 is a flowchart generally summarizing one approach to the execution of a dummy read operation method directed to a designated unit of a storage device according to embodiments of the inventive concept. Referring to FIGS. 1 and 8, the dummy read operation includes determining whether a read count (Read CNT) derived from a read count table is greater that a predetermined value (PDV) (or "count value limit") (S110). Here, the predetermined value (PDV) may be a variable value based on one or more environmental factors characterized by the environmental information stored in the RINC management unit 210 of FIG. 1. If the read count is greater than the predetermined value (PDV), the dummy read operation for reliability verification is executed (S120). Here, the dummy read operation may be a read operation directed to memory cells connected to an adjacent word line, or memory cells connected to an open word line.

Otherwise, if the read count is not greater than the predetermined value (PDV), the dummy read operation is not executed. In this manner, a dummy read operation according to embodiments of the inventive concept may be executed when the read count is greater than the predetermined value which is variable according to environmental information.

Figure 9:
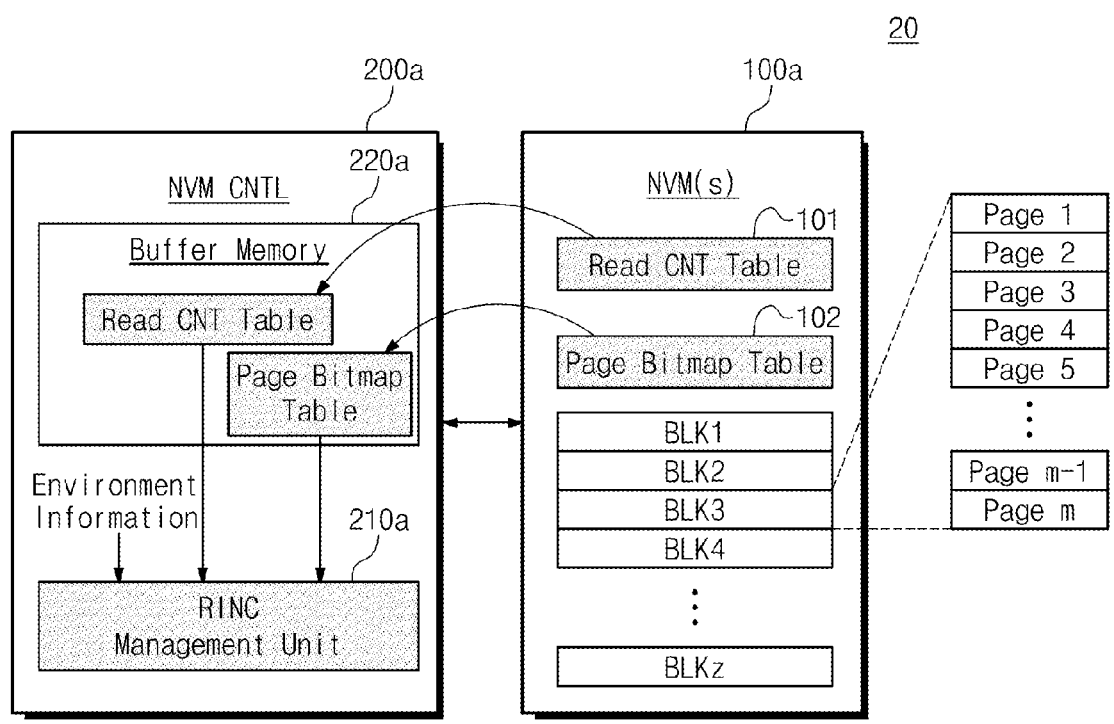
FIG. 9 is a block diagram illustrating a storage device according embodiments of the inventive concept.

FIG. 9 is a block diagram illustrating another storage device according to the embodiments of inventive concept. Referring to FIG. 9, a storage device 20 is substantially similar to the storage device 10 of FIG. 1, except for the additional provision of a page bitmap table by the memory device 110a and the storage and reference of the page bitmap table by the buffer memory 220a of the memory device controller 200a.

Thus, the memory device 100a includes a page bitmap table 102, where the page bitmap table stores (e.g.,) a single bit (0/1) indicating whether a corresponding data of page is valid. For example, if a bit corresponding to a certain page is "1", the stored data is valid, but if the bit corresponding to the certain page is "0", the stored data is invalid.

The RINC management unit 210a may be used to manage the execution of a reliability verification operation (or RINC operation) based on the read count table 101, the page bitmap table 102, and environmental information. In this manner, the RINC management unit 210a may selectively omit execution of the reliability verification operation in cases where the designated unit (e.g., a word line or page) stores invalid data, according to reference had from the page bitmap table 102. Alternately or additionally, the RINC management unit 210a may selectively omit execution of the reliability verification operation for a designated page when the page bitmap table 102 indicates that a data error rate associated with data stored in the designated page exceeds a predetermined threshold.

Figure 10:
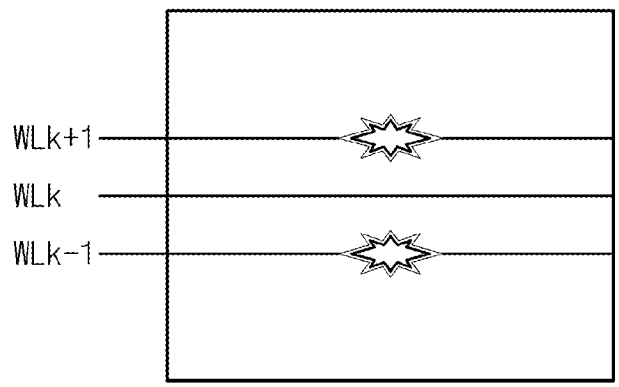
FIGS. 10 and 11 are respective conceptual diagrams illustrating a dummy read operation method according to embodiments of the inventive concept.

FIG. 10 is a conceptual diagram illustrating execution of a reliability verification operation according to the state of an adjacent word line. Referring to FIG. 10, execution of the reliability verification operation may be omitted for a designated word line WLk (i.e., where the designated unit is a word line) according to the data state of one or both adjacent word lines WLk+1, WLk−1. For example, when the page bitmap table 102 indicates that data stored in memory cells connected the adjacent word lines WLk+1, WLk−1 is invalid, the reliability verification operation may be omitted.

Figure 11:
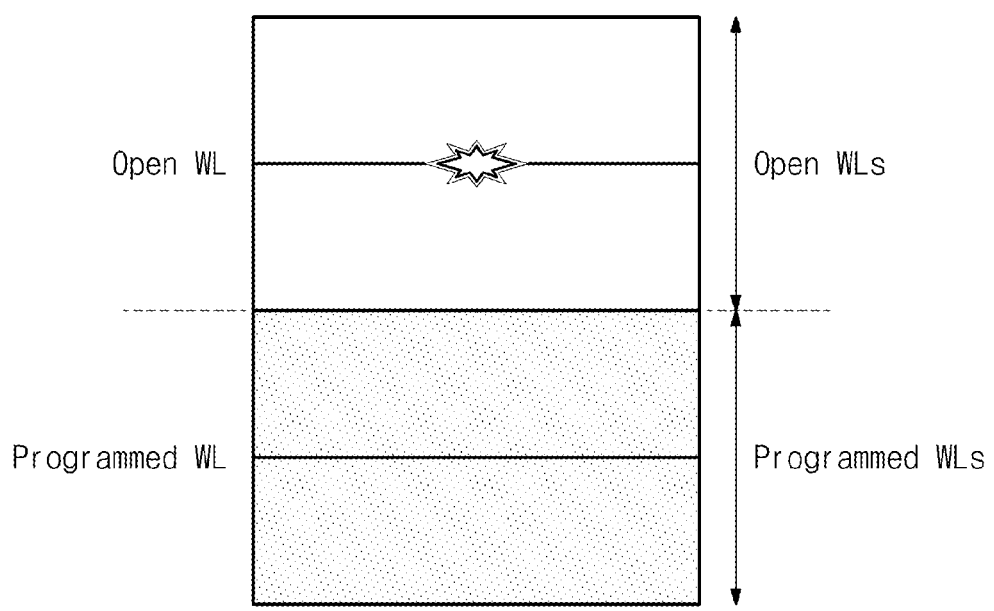

FIG. 11 is another conceptual diagram illustrating execution of a reliability verification operation according to a state of an open word line (Open WL). Referring to FIG. 11, with reference to the page bitmap table 102, when a rate at which word lines are programmed (Programmed WL and Programmed WLs) and open word lines (Open WLs) is greater than a predetermined rate, the reliability verification operation may be omitted.

Figure 12:
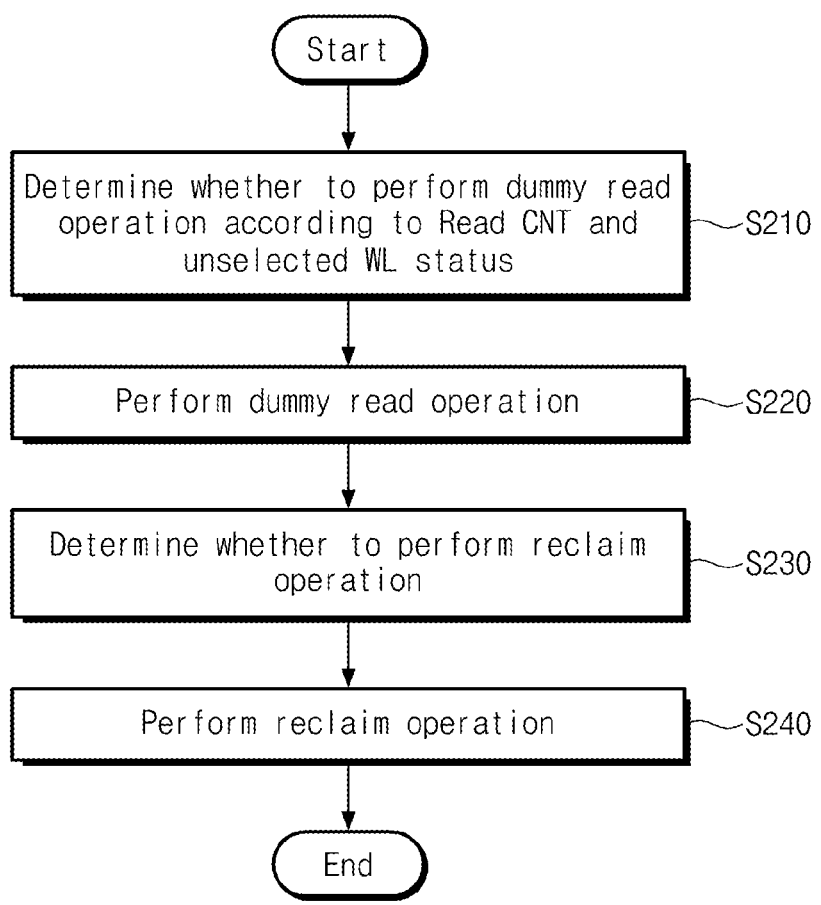
FIG. 12 is a flowchart summarizing a method controlling RINC according to embodiments of the inventive concept.

FIG. 12 is a flowchart summarizing a reliability verification operation (RINC operation) used by a storage device according to embodiments of inventive concept. Referring to FIGS. 9 and 12, a determination is made to execute the dummy read operation in view of the read count (Read CNT) and a state of an unselected word line (S210). Here, the unselected word line may a word line adjacent to a designated word line or an open word line. The state of unselected word line may be understood with reference to the page bitmap table 102. Then, the dummy read operation is executed with respect to the adjacent word line or open word line as part of a reliability verification operation (S220).

As a result of the dummy read operation, a determination is made to execute a read reclaim (or read refresh) operation (S230) and the read reclaim operation is executed (S240). For example, as the result of dummy read operation, if a number of read data errors is greater than a predetermine value, the read reclaim operation should be executed. In certain embodiments of the inventive concept, the read reclaim operation will consist of programming (or re-programming) the data stored by memory cells connected to the designated word line to memory cells connected to another word line.

In the foregoing description of embodiments related to FIGS. 1 through 12, a memory controller of a storage device including a nonvolatile memory manages the execution of a reliability verification operation in view of at least one of environmental information, read count information and page bitmap information stored in a memory controller. However, embodiments of the inventive concept are not limited to only these approaches to executing a reliability verification operation.

Figure 13:
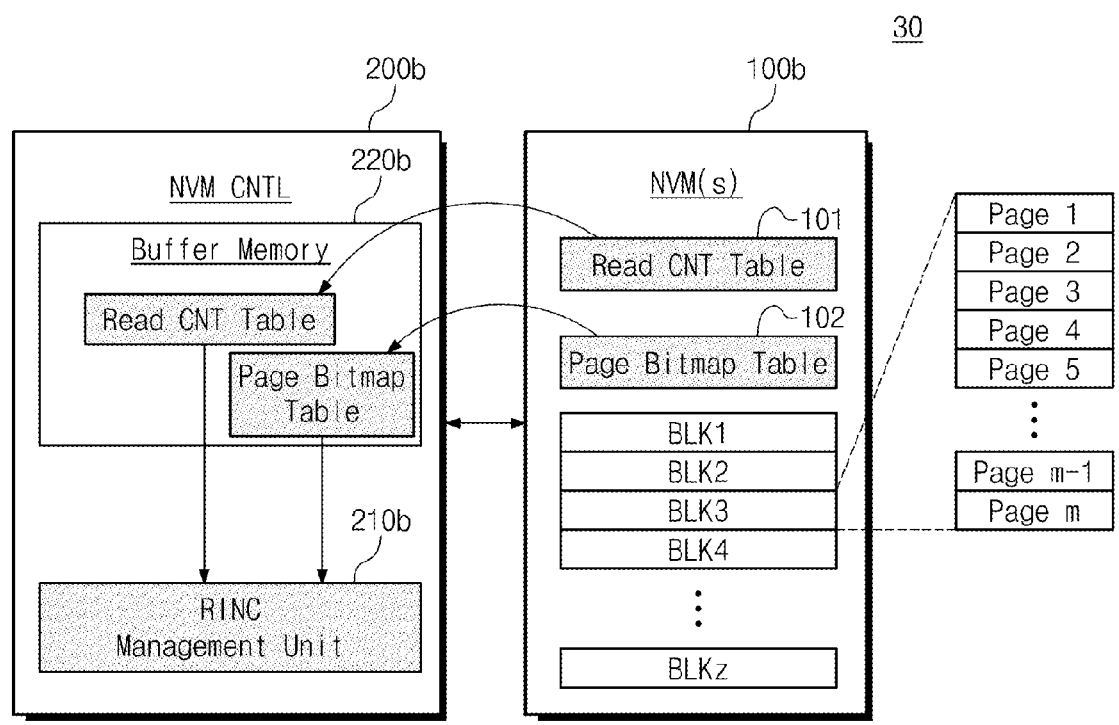
FIG. 13 is a block diagram illustrating a storage device according to embodiments of the inventive concept.

FIG. 13 is a block diagram illustrating another storage device 30 according to embodiments of the inventive concept. Here, the storage device 30 is similarly configured in comparison with the storage device 20 of FIG. 9, except environmental information is not stored in the memory controller 200b and is not used to determine the execution of a reliability verification operation.

Thus, the RINC management unit 210b may manage the execution of the reliability verification operation (RINC operation) based on the read count and page bitmap information only.

Figure 14:
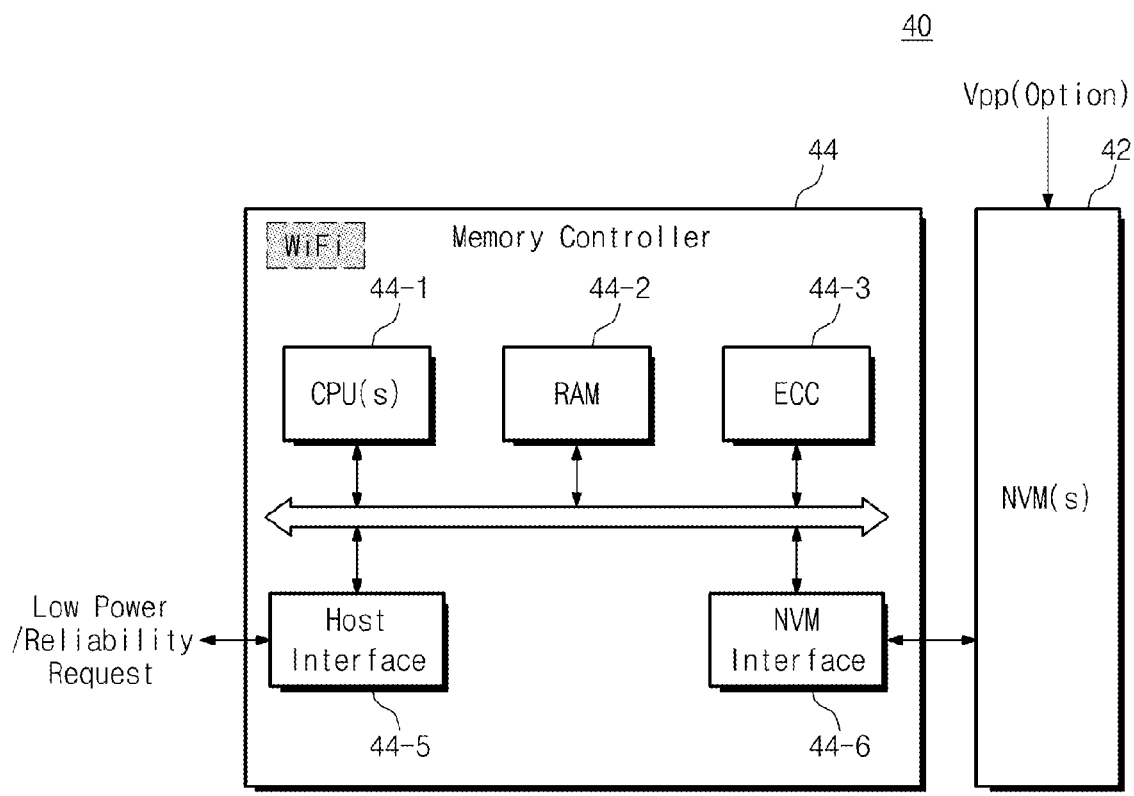
FIG. 14 is a block diagram illustrating a memory system according to embodiments of the inventive concept.

FIG. 14 is a block diagram illustrating a memory system 40 according to the embodiments of the inventive concept. Referring to FIG. 14, the memory system 40 includes at least one nonvolatile memory device 42 (hereafter, "the memory device 42") and a memory controller 44 controlling the memory device 42. In FIG. 14, the illustrated memory system 40 may be a storage medium such as a memory card, such as a CF, SD, micro-SD, a USB storage device, etc.

The memory device 42 (NVMs) may be embodied as the memory device 100 of FIG. 1, the memory device 100a of FIG. 9, or the memory device 100b of FIG. 13. The memory controller 44 may be embodied as the memory controller 200a of FIG. 9 or the memory controller 200b of FIG. 13.

Thus, the memory controller 44 may be used to manage the execution of a reliability verification operation (RINC operation) in response to a request received from a host. For example, a dummy read operation associated with a reliability verification operation may be executed when the storage device 40 is placed in a low power/reliability mode by the corresponding request form the host. In this mode, the memory controller 44 may be configured to preferentially execute the reliability verification operation.

In this regard, the memory controller 44 may be used to control the execution of read, write and/or erase operation(s) with respect to the memory device 42 in response to corresponding requests from the host. The memory controller 44 may include at least one of central processing unit (CPU) 44-1, a buffer memory (or Random Access Memory—RAM) 44-2, an error correction (ECC) circuit 44-3, a host interface 44-5, and a nonvolatile memory device (NVM) interface 44-6.

The CPU 44-1 may be used to control the overall operation (e.g., execution of read/write operations, file system management, bad page management etc.) of the memory device 42.

The RAM 44-2 may operate under the control of central processing unit 44-1, and be used as a working memory, buffer memory and/or cache memory. When used as a working memory, the RAM 44-2 may be used to temporarily store data processed by the CPU 44-1. When used as a buffer memory, data may be stored by the RAM 44-2 as it is communicated between the host and the memory device 42. When used as a cache memory, the RAM 44-2 may be used to cache data between the low-speed memory device 42 and other high-speed components.

The ECC circuit 44-3 may be used to generate error correction (ECC) code to correct fail bit(s) or error bit(s) received from the memory device 42. The ECC circuit 44-3 may execute error correction encoding of data provided to nonvolatile memory device 42 and generate data added parity bit. The parity bit may be stored at the memory device 42. Also ECC circuit 44-3 may execute error correction decoding regarding to data received from the nonvolatile memory device 42. The ECC circuit 44-3 may correct errors using parity. The ECC circuit 44-3 may correct errors using low density parity check (LDPC) code, BHC code, turbo code, Red-Solomon code, convolution code, recursive systematic code (RSC), trellis-coded modulation (TCM), block coded modulation (BCM) and/or coded modulation.

The memory controller 44 may transmit and receive data to/from the host via the host interface 44-5. The memory controller 44 may transmit and receive data to/from the memory device 42 via the NVM interface 44-6. The host interface 44-5 may communicate with host via parallel AT attachment bus (PATA), serial AT attachment bus (SATA), SCSI, USB, PCIe, SD, SAS, UFS, and NAND interface.

In certain embodiments of inventive concept, the memory controller 44 may include wireless communication function (e.g., a function capable of establishing a Wi-Fi connection with the host).

Thus, for the foregoing it will be understood that the storage device 40 of FIG. 14 may execute a read operation which has high reliability and is optimized by executing the reliability verification operation (RINC operation) in response to a externally provided request.

Figure 15:
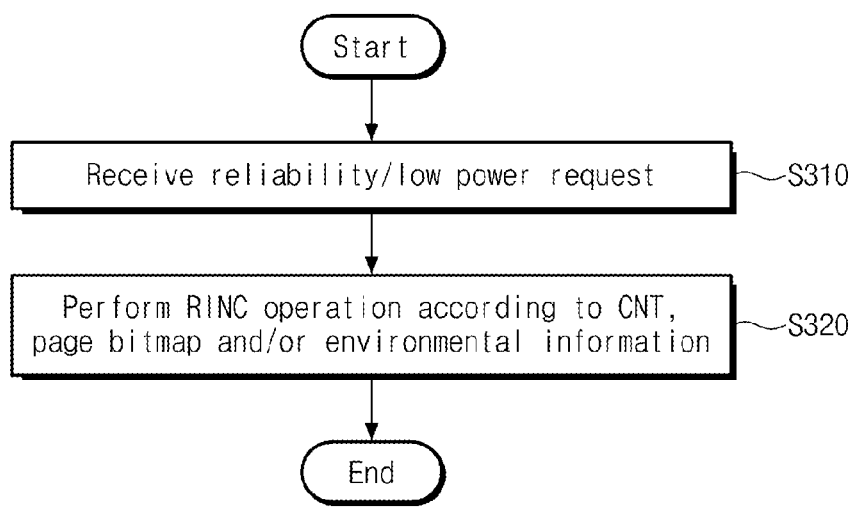
FIG. 15 is a flowchart summarizing a method of dummy read operation according to embodiments of the inventive concept.

FIG. 15 is a flowchart generally summarizing the execution of a dummy read operation by the memory system 40 of FIG. 14. Referring to FIGS. 14 and 15, a reliability/low power request is received from an external source (e.g., a host) (S310). In response to the reliability/low power request, a RINC operation is executed, where the dummy read operation may be executed in response to read count (CNT) information, page bitmap information, and/or environmental information (S320).

Figure 16:
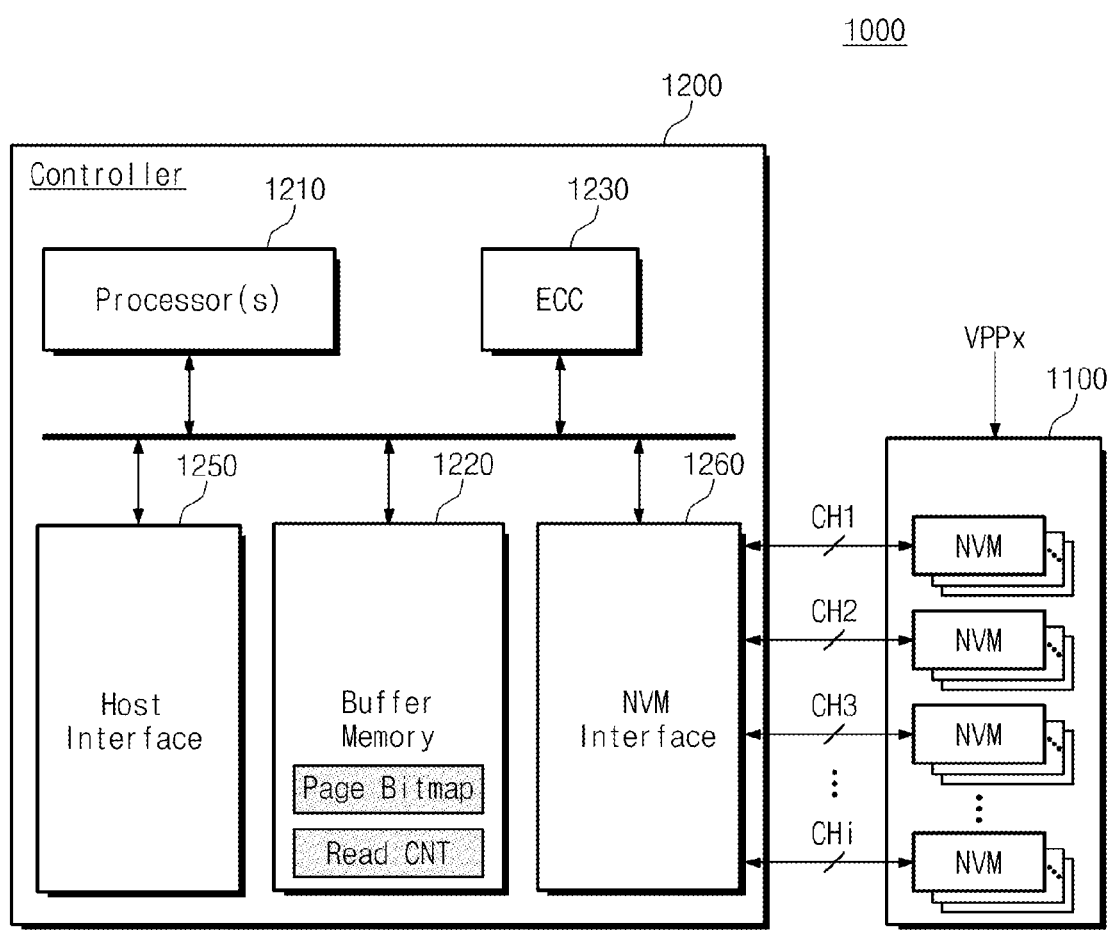
FIG. 16 is a block diagram illustrating a SSD according to embodiments of the inventive concept.

FIG. 16 is a block diagram illustrating a solid state drive (SSD) according to embodiments of inventive concept. Referring to the FIG. 16, the SSD 1000 may include a plurality of nonvolatile memory device 1100 and SSD controller 1200.

Figure 17:
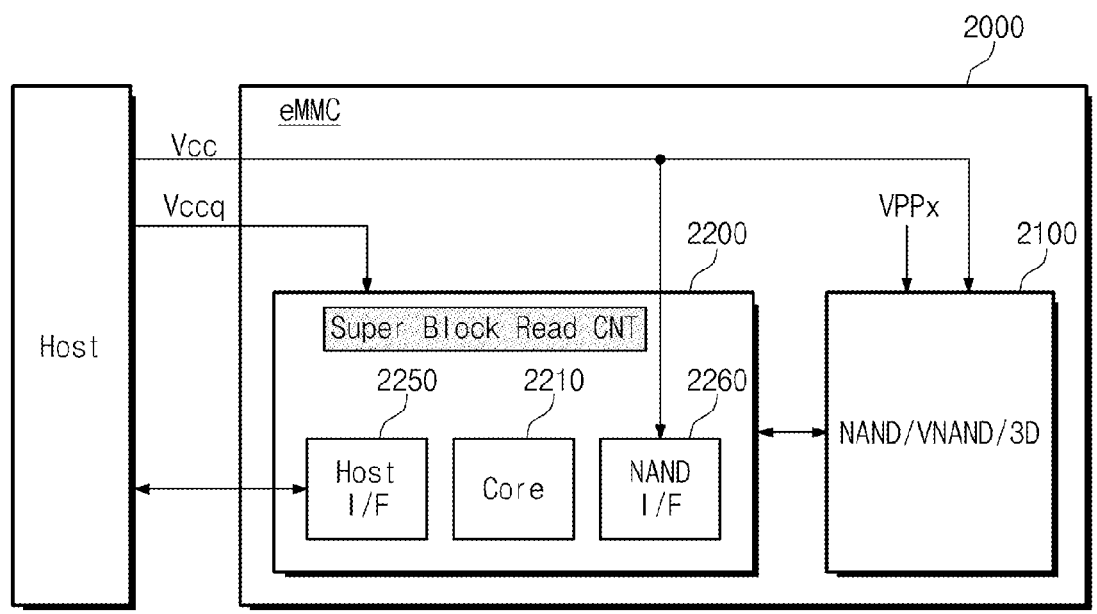
FIG. 17 is a block diagram illustrating an eMMC according to embodiments of the inventive concept.

The nonvolatile memory devices 1100 may be embodied optionally supplied outside high voltage (Vpp) (Vpp (Option) in FIG. 14, and VPPx in FIGS. 16 and 17). Each of the nonvolatile memory devices 1100 (NVMs) may be embodied as the nonvolatile memory device 100 described in FIG. 1, nonvolatile memory device 100a of FIG. 9, the nonvolatile memory device 100b of FIG. 13, or the nonvolatile memory device 42 of FIG. 14.

The SSD controller 1200 may be connected to the nonvolatile memory devices 1100 via a plurality of channels (CH1~Chi, where 'I' is an integer greater than 1). The SSD controller 1200 may be embodied as the memory controller of FIG. 1, the memory controller 200a of FIG. 9, the memory controller 200b of FIG. 13, or the memory controller 44 of FIG. 14.

The SSD controller 1200 may include at least one processor 1210, a buffer memory 1220, an error correction circuit 1230, a host interface 1250, and a nonvolatile memory interface 1260.

The buffer memory 1220 may temporally store data for an operation of the memory controller 1200. The buffer memory 1220 may include a plurality of memory lines to store data or command. Herein, the plurality of memory lines may be mapped with cache lines in various manners. The buffer memory 1220 may store page bitmap information and read count (CNT). The page bitmap information or the read count information may be read from the nonvolatile memory device 1100 at power-up, and be updated according to the internal operation. Updated page bitmap information or read count information may be stored periodically or aperiodically in the nonvolatile memory device 1100.

The error correction circuit 1230 may calculate an error correction code of data to be programmed in a write operation. The error correction circuit 1230 may correct error based on the error correction code value. The error correction circuit 1230 may correct errors of data restored from the nonvolatile memory device 1100 in data restoring operation. The error correction circuit 1230 may include a code memory (not shown) to store necessity code data to operate the memory controller 1200. The code memory may be embodied as nonvolatile memory device.

The host interface 1250 may interface with outside devices. The host interface 1250 may be a NAND flash interface. The host interface 1250 may be embodied in manner of various interface. The host interface 1250 may be embodied a plurality of interfaces. The nonvolatile memory interface 1260 may offer an interface function with the nonvolatile memory device 1100.

The SSD 1000 according embodiments of inventive concept may manage the reliability verification operation based on the read count information and page bitmap information. Thus the SSD 1000 may maintain high data reliability.

Certain embodiments of the inventive concept may be applied to embedded multimedia cards (eMMC) such as the movi-NAND or iNAND. FIG. 17 is a block diagram illustrating an eMMC according to embodiments of inventive concept. Referring to FIG. 17, the eMMC 2000 may include at least one NAND flash memory device 2100 (NAND/VNAND/3D) and a controller 2000.

The NAND flash memory device 2100 may be embodied as the memory device 100 of FIG. 1, the memory device 100a of FIG. 9, the memory device 100b of FIG. 13 and/or the memory device 42 of FIG. 14. The memory controller 2200 may be connected the NAND flash memory device 2100 via a channel. The memory controller 2200 may be embodied as the memory controller 200 of FIG. 1, the memory controller 200a of FIG. 9, the memory controller 200b of FIG. 13, and/or the memory controller 44 of FIG. 14.

The memory controller 2200 may control at least one controller core 2210, a host interface 2250, and NAND interface 2260. The at least one controller core 2210 may control overall operations of the eMMC 2000. The host interface 2250 may execute interfacing with the controller 2210 and the host. The NAND interface 2260 may execute interfacing with the NAND flash memory device 2100 and the controller 2200. In certain embodiments of inventive concept, the host interface 2250 may be parallel interface (for example, MMC interface). In other embodiments of inventive concept, the host interface 2250 of the eMMC 2000 may be series interface (for example, UHS-II, UFS interface). In another embodiments of the inventive concept, the host interface 2250 may be NAND interface.

The memory controller 2200 may manage a read count (CNT) by unit of super block, and execute the reliability verification operation (RINC operation) based on the read count and environmental information.

The eMMC 2000 may receive source voltages (Vcc, Vccq) from the host. Herein, the first source voltage (Vcc, for example 3.3V) is provided to the NANA flash device 1100 and NAND interface 1230. The second source voltage (Vccq, for example, 1.8V/3.3V) is provided to the controller 1200. In embodiments of inventive concept, the eMMC 1000 may optionally receive outside high voltage (Vpp).

The eMMC 2000 may reduce error occurrence rate by raising data reliability, and perform high speed operation according to the error occurrence rate.

Figure 18:
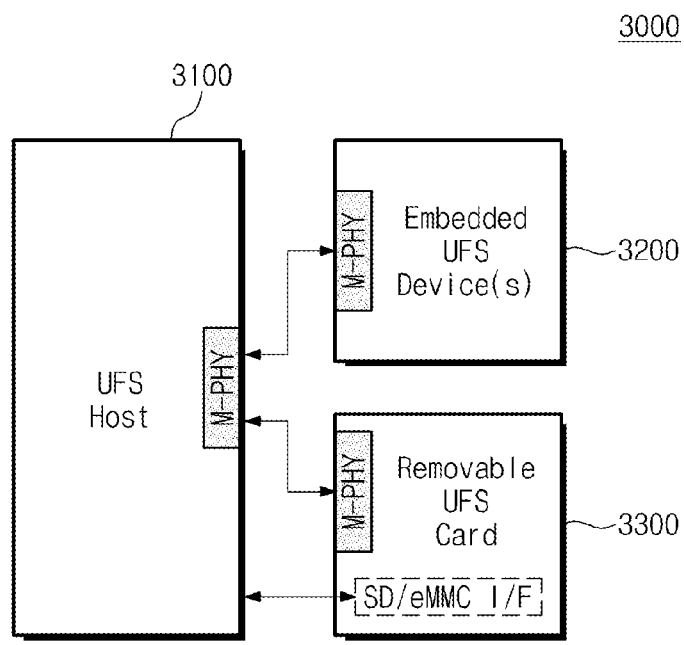
FIG. 18 is a block diagram illustrating an UFS system according to embodiments of the inventive concept.

Certain embodiments of the inventive concept may be applied to Universal Flash Storage (UFS) applications. FIG. 18 is a block diagram illustrating a USF system according to the embodiments of inventive concept. Referring to FIG. 18, the UFS system 3000 may include a UFS host 3100, at least one embedded UFS device 3200, and a detachable UFS device 3300. Communication between the UFS host 3100 and the embedded UFS device 3200 may be performed via M-PHY layer. Communication between the UFS host 3100 and the detachable UFS card 3300 may be performed via M-PHY layer.

At least one of the embedded UFS device 3200 and the detachable UFS card 3300 may be embodied at least one of the storage device 10 of FIG. 1, the storage device 20 of FIG. 9, the storage device 30 of FIG. 13, and the storage device 40 of FIG. 14.

The detachable UFS card 3400 may include a bridge to communicate via other protocol not UFS. The UFS host 3100 and the detachable UFS card 3400 may communicate via various card protocol (for example, UFDs, MMC, eMMC, SD (secure digital), mini SD, Micro SD etc).

Figure 19:
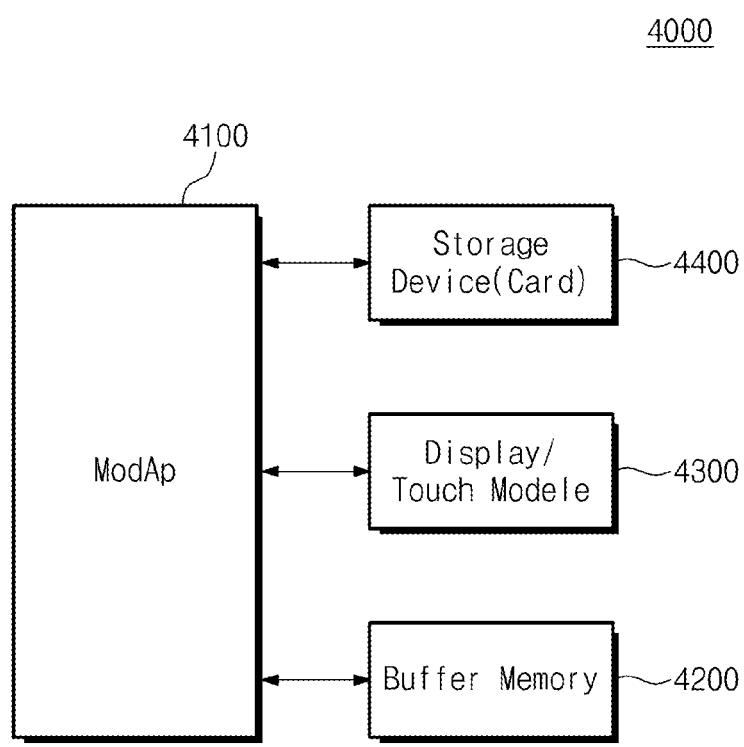
FIG. 19 is a block diagram illustrating an electron device according to embodiments of the inventive concept.

Other embodiments of the inventive concept may be applied to mobile devices. FIG. 19 is a block diagram illustrating a mobile device according to embodiments of the inventive concept. Referring to FIG. 19, the mobile device 4000 may include a ModAP (modem application processor) 4100, a buffer memory 4200, a display/touch module 4300, and a storage device 4400.

The ModAP 4100 may be used to control the overall operation of the mobile device 4000 and external wired/wireless communication. The buffer memory 4200 may store data required in mobile device 4000 operations. The display/touch module 4300 may display data processed at ModAP 4100. The display/touch module 4300 may receive data from the touch panel. The storage device 4400 may store user data. The store device 4400 may be a eMMC, SSD, UFS device. The storage device 4400 may control the reliability verification operation (RINC operation) based on the read count and environmental information.

The mobile device 4000 according to the inventive concept may execute the reliability verification operation based on read count information, page bitmap information and/or environmental information. Therefore, the mobile device 4000 may have optimal operation performance.

The memory system or storage device according to embodiments of the inventive concept may be mounted using various package form. In embodiments of the inventive concept, the memory system or storage device may be mounted using PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc.

Figure 20A:
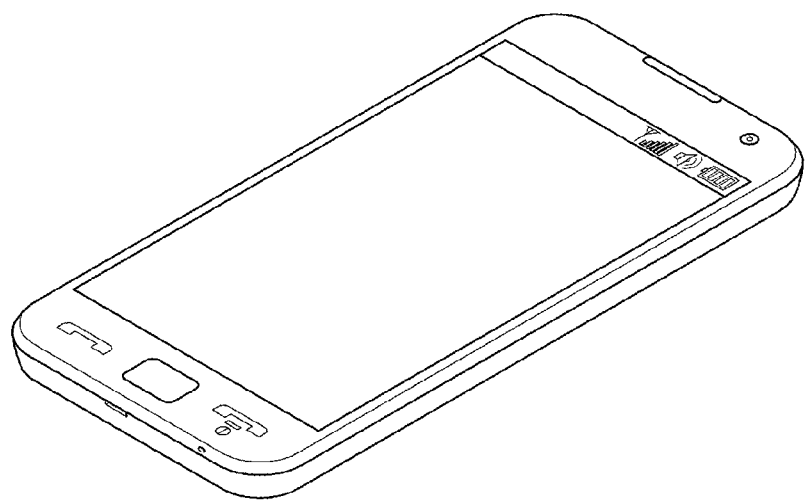
FIGS. 20A, 20B and 20C illustrate different smart appliances that may incorporate an embodiment of the inventive concept.
Figure 20B:
Figure 20C:
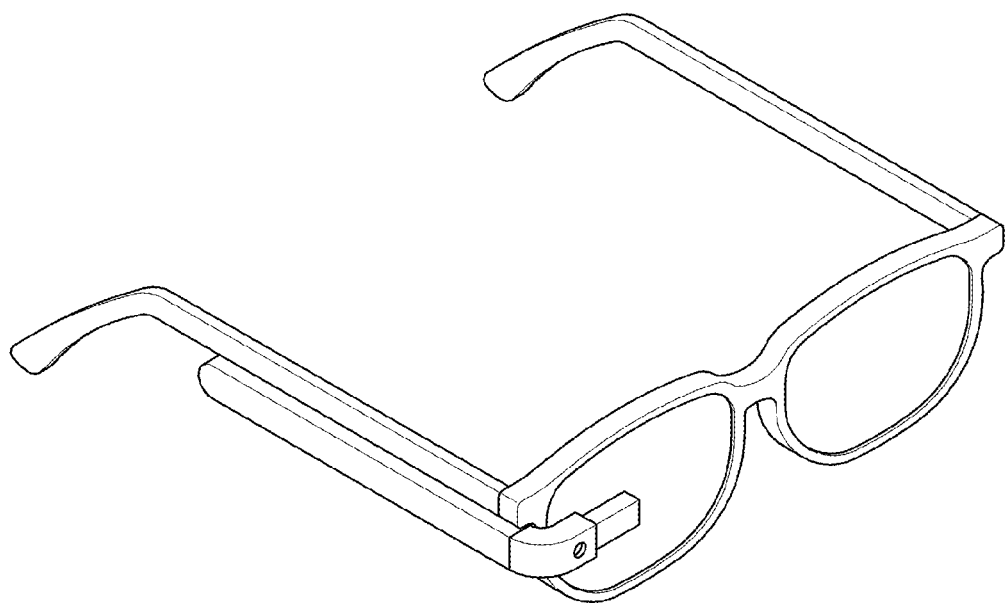

Each one of FIGS. 20A, 20B and 20C illustrate a smart appliance that may incorporate an embodiment of the inventive concept. FIG. 20A illustrates a smart phone; FIG. 20B illustrates a smart watch, and FIG. 20C illustrates a smart pair of eyeglasses.

The above-disclosed subject matter is to be considered illustrative in nature, and the scope of the following claims extends over many modifications and enhancements that will become apparent to those of ordinary skill in the art upon consideration of the foregoing. Thus, to the maximum extent allowed by law, the scope of the claims shall be determined by the broadest permissible interpretation, and shall not be restricted or limited to only the foregoing illustrated embodiments.

What is claimed is:

1. A storage device comprising:
   a nonvolatile memory device including a plurality of memory blocks; and
   a memory controller configured to control the nonvolatile memory device,
   wherein in response to a read request identifying a memory block among the plurality of memory blocks, the memory controller is configured to execute a reliability verification operation directed to the memory block in response to one of a read count and an environmental information, and the read count and a state information associated with an unselected word line.

2. The storage device of claim 1, wherein the nonvolatile memory device maintains at least one of a read count table storing the read count, and a page bitmap table storing the state information associated with the unselected word line.

3. The storage device of claim 2, wherein upon power up of the storage device, the at least one of the read count table and the page bitmap table is stored in an internal buffer memory of the memory controller.

4. The storage device of claim 1, wherein the memory controller further comprises a random interval neighbor check management unit that controls execution of the reliability verification operation.

5. The storage device of claim 4, wherein the random interval neighbor check management unit is responsive to an externally provided activation request.

6. A method of controlling an execution of a reliability verification operation in a storage device including a nonvolatile memory device and a memory controller, the method comprising:
   determining whether a read count for a designated unit within the nonvolatile memory device exceeds a count value limit; and
   upon determining that the read count exceeds the count value limit, executing the reliability verification operation directed to the designated unit,
   wherein the count value limit is based on at least one of a read count information, a page bitmap information and an environment information stored in the storage device.

7. The method of claim 6, wherein the designated unit is one of a super block, a block, a sub-block, multiple pages, a page, a selected word line, and an open word line of the nonvolatile memory device.

8. The method of claim 6, wherein the read count indicates at least one of a number of read operations executed in response to an externally generated read request, and read operations executed in response to an internally generated request.

9. The method of claim 7, wherein executing the reliability verification operation includes executing at least one dummy read operation.

10. The method of claim 9, wherein the designated unit is a selected word line, and the least one dummy read operation is directed to at least one memory cell connected to a word line adjacent to the selected word line.

11. The method of claim 9, wherein the designated unit is a selected word line and the at least one dummy read operation is directed to at least one memory cell connected to an open word line disposed in an upper portion of the selected word line.

12. The method of claim 6, wherein the environment information is organized in relation to different areas of the nonvolatile memory device, and
the count value limit varies according to an area among different areas including the designated unit.

13. The method of claim 6, wherein the environment information includes a number of program/erase (P/E) cycles for each block among a plurality of blocks of the nonvolatile memory device, and
the count value limit varies according to the block among the plurality of blocks including the designated unit.

14. The method of claim 6, wherein the designated unit is a page, and the method further comprises:
generating a page bitmap table including page bitmap information indicating for each page among a plurality of pages of the nonvolatile memory whether data stored by the page is valid or invalid; and
selectively omitting a reliability verification operation directed to a page storing invalid data by referencing the page bitmap table.

15. The method of claim 6, wherein the designated unit is a selected word line, and the method further comprises:
generating a page bitmap table including page bitmap information indicating for memory cells connected to each one of a plurality of word lines whether the data stored by the memory cells is valid or invalid; and
selectively omitting a reliability verification operation directed to a selected word line when data stored in memory cells connected to a word line adjacent to the selected word line is invalid by referencing the page bitmap table.

16. The method of claim 6, wherein the designated unit is a selected word line, and the method further comprises:
generating a page bitmap table including page bitmap information indicating for memory cells connected to each one of a plurality of word lines whether the data stored by the memory cells is valid or invalid; and
selectively omitting a reliability verification operation directed to a selected word line if a number of open word lines is less than a predetermined value by referencing the page bitmap table.

17. The method of claim 6, further comprising:
determining whether a read reclaim operation is executed based on a result of executing the reliability verification operation.

18. A method of operating a storage device including a nonvolatile memory device and a memory controller controlling an operation of the nonvolatile memory device, the method comprising:
maintaining in the nonvolatile memory device a read count table listing a number of read requests directed to each one of a plurality of designated units within the nonvolatile memory device;
upon receiving a read request direct to memory cells of a selected word line, determining whether to execute a dummy read operation in response to a read count stored in the read count table and a state information associated with an unselected word line;
executing the dummy read operation directed to either memory cells connected to an open word line, or memory cells connected to a word line adjacent to the selected word line;
determining whether to execute a read reclaim operation based on a result of executing the dummy read operation; and
executing the read reclaim operation directed to a memory block including the memory cells connected to the selected word line.

19. The method of claim 18, wherein the state information associated with the unselected word line is managed according to a page bitmap table.

20. The method of claim 18, wherein the determining of whether to execute the dummy read operation comprises referencing environmental information stored in the memory controller, wherein the environmental information includes at least one of program/erase cycle information, a program count, an erase count, a number of errors occurred during a read operation, threshold voltage shift information, wear level information, degradation information, data input/output time information, temperature information, memory cell location information, and structure information.

21. The method of claim 18, wherein the determining of whether to execute the read reclaim operation comprises referencing a number of errors occurring during the dummy read operation.

22. The method of claim 18, further comprising:
resetting a read count in the read count table for the memory block following execution of the read reclaim operation.

23. The method of claim 18, wherein the read reclaim operation is executed by reprogramming the memory block.

* * * * *